United States Patent
Lou

(12)
(10) Patent No.: US 6,245,633 B1
(45) Date of Patent: Jun. 12, 2001

(54) FABRICATION METHOD FOR A DOUBLE-SIDE DOUBLE-CROWN STACKED CAPACITOR

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/454,387

(22) Filed: Dec. 3, 1999

(30) Foreign Application Priority Data

Nov. 4, 1999 (TW) ................................. 088119201

(51) Int. Cl.[7] ..................................... H01L 21/20
(52) U.S. Cl. .................. 438/398; 438/438; 438/666; 438/254; 438/964
(58) Field of Search ................................ 438/398, 255, 438/256, 665, 964, 666, 254

(56) References Cited

FOREIGN PATENT DOCUMENTS

06021390A * 1/1994 (JP) .............................. H01L/27/108

* cited by examiner

*Primary Examiner*—Charles Bowers
*Assistant Examiner*—Yennhu B. Huynh
(74) *Attorney, Agent, or Firm*—Jiawei Huang; J.C. Patents

(57) ABSTRACT

A method for fabricating a stacked capacitor is described, which is applicable to the fabrication of a capacitor with a double-sided double crown bottom electrode. The first crown structure of the bottom electrode is established by forming a patterned material layer which comprises an opening on the substratae as the framework of the amorphous silicon layer of the bottom electrode. The second crown structure of the bottom electrode is to established on the above amorphous silicon layer by forming an amorphous silicon spacer on the sidewall of another patterned material layer.

14 Claims, 7 Drawing Sheets

FABRICATION METHOD FOR A DOUBLE-SIDE DOUBLE-CROWN STACKED CAPACITOR

CROSS-REFERENCE TO RELATED APPLICATION

This application claims the priority benefit of Taiwan application serial no. 88119201, filed Nov. 4, 1999.

BACKGROUND OF THE INVENTION

1. Field of the Invention

The present invention relates to a fabrication method for a capacitor of a semiconductor memory device. More particularly, the present invention relates to a fabrication method for a stacked capacitor of a dynamic random access memory (DRAM) device.

2. Description of the Related Art

As semiconductors enter the stage of the deep sub-micron manufacturing, the device dimensions continue to reduce; in another words, the allowable capacitor area becomes smaller in a DRAM device. The size of the software used in computers, on the other hand, is getting larger, the required memory capacity thus needs to be increased. With the demands of a continuous downsizing of the device dimension and an increase for the memory capacity, the conventional approach in fabricating a dynamic random access memory capacitor must be changed to accommodate the current trend of development of semiconductor devices.

Although a stacked capacitor is the major technique employed in the manufacturing for a conventional semiconductor capacitor, related research on stacked capacitor continues even the fabrication of semiconductors has entered the stage of deep sub-micro manufacturing.

Although a stacked capacitor, for example, the crown type, the fin type, the cylinder type or the spread type, can meet the demand of a highly integrated DRAM device, it is very difficult to use the stacked type capacitor for a 256 Mega or 1 Giga bit capacitor due to the limited design rule.

FIGS. 1A to 1E are schematic cross-sectional view showing the manufacturing of a double-sided stacked capacitor according to the prior art.

As shown in FIG. 1A, a substrate 100, comprising devices, is sequentially covered with a silicon oxide layer 102 and a silicon nitride layer 104. The silicon oxide layer 102 serves as an inter-layer dielectric (ILD), and the silicon nitride layer 104 is an etching stop layer during the formation of the double-sided crown structure of the capacitor.

Photolithography and etching are further conducted to define a contact opening 106 in the silicon oxide layer 102 and the silicon nitride layer 104. A doped polysilicon plug 107 is further formed in the contact opening 106.

Referring to FIG. 1B, an insulation layer 108 is then formed, covering the silicon nitride layer 104 and the polysilicon plug 107. Photolithography and etching are further conducted to define an opening 110 in the insulation layer 108, exposing the polysilicon plug 107 and a portion of the silicon nitride layer 104.

As shown in FIG. 1C, a conformal amorphous silicon layer 112 is formed on the substrate 100, covering the opening 110.

Referring to FIG. 1D, using the insulation layer 108 as a polishing stop layer, the amorphous silicon layer 112 covering the surface of the insulation layer 108 is removed, leaving the remaining amorphous silicon layer 112a in the opening 110.

Continuing to FIG. 1E, using the silicon nitride layer 104 as an etching stop layer, the insulation layer 108 covering the surface of the silicon nitride layer 104 is removed.

At this point, a capacitor with a crown structure is thus formed. A hemispherical grain polysilicon layer is then formed on the amorphous silicon layer 112a, followed by sequentially forming the dielectric layer of the capacitor and the upper electrode of the capacitor to complete the formation of a double-sided crown structured capacitor.

The capacitance of the capacitor formed according to the above prior art, however, can not meet the requirements of a 256M or 1G DRAM device.

SUMMARY OF THE INVENTION

Based on the foregoing, the present invention provides a fabrication method for a stacked capacitor, wherein a dielectric layer and an etching stop layer are formed on the substrate, and a contact plug is formed in the dielectric layer and the etching stop layer. After this, a first material layer is also formed on the etching stop layer and then patterned to form an opening which exposes a portion of the etching stop layer and the contact plug. A first amorphous silicon layer is then formed on the substrate, followed by forming and patterning a second material layer. Chemical dry etching is then conducted to remove a portion of the first amorphous silicon layer which covers the surface of the first material layer. The first amorphous silicon layer remaining on the sidewall and on the bottom of the opening forms a crown shaped amorphous silicon layer. A second amorphous silicon layer is then formed on the substrate, followed by performing anisotropic etching to form an amorphous silicon spacer. The second material layer and the first material layer are removed. Thereafter, a selective hemispherical grain polysilicon layer is formed on the exposed surfaces of the crown shaped amorphous silicon layer and the amorphous silicon spacer to form a bottom electrode with a double sided, double crown structure. Subsequently, a capacitor dielectric layer and an upper electrode are formed.

To increase the surface area of the bottom electrode according to the present invention is through the formation of a bottom electrode with a double-sided double crown structure. The memory capacity of the memory device is thereby increased.

The double-sided double crown structured bottom electrode of the present invention is formed by a crown shaped amorphous silicon layer and an amorphous silicon spacer.

The fabrication method for a stacked capacitor according to the present invention only applies the typical deposition, photolithography and etching techniques to achieve the purpose of increasing the memory capacity of a memory device. Since the more expensive chemical mechanical polishing process is not required for the fabrication method of the present invention and the process window is greater, the method of the present invention is simpler and the manufacturing cost is lower.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2H are schematic, cross-sectional views showing the fabrication of a double-sided, double crown stacked capacitor according to a preferred embodiment of the present invention.

Figure 1A:
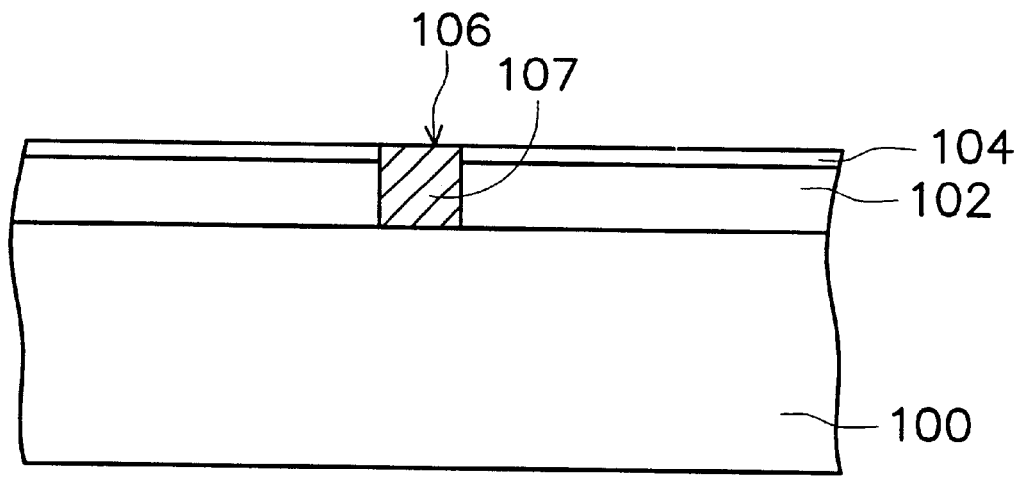
FIGS. 1A to 1E are schematic, cross-sectional views showing the fabrication of a double sided crown stacked capacitor according to the conventional practice.
Figure 1B:
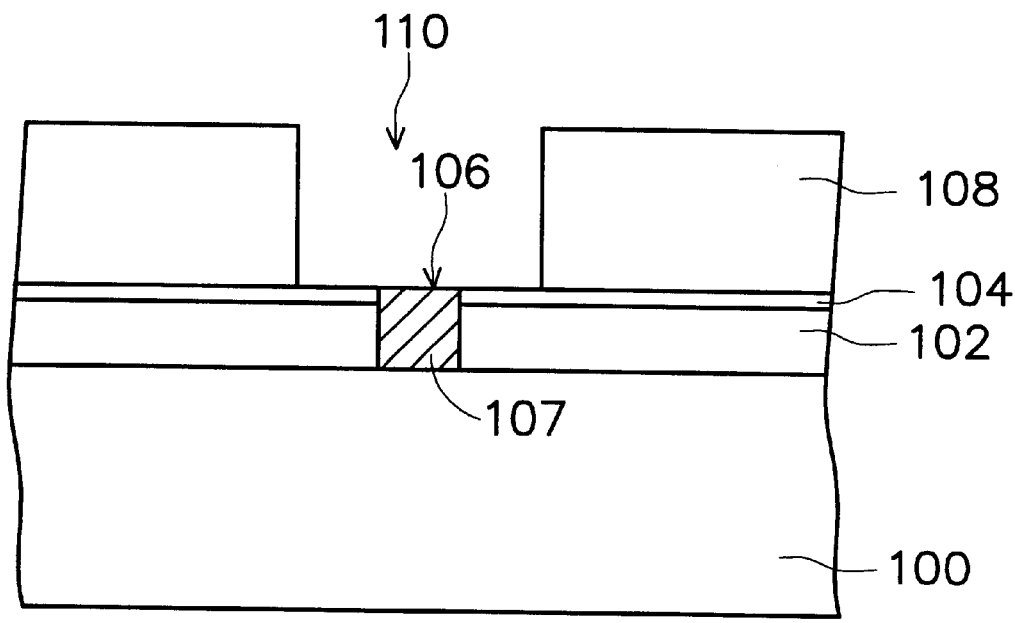
Figure 1C:
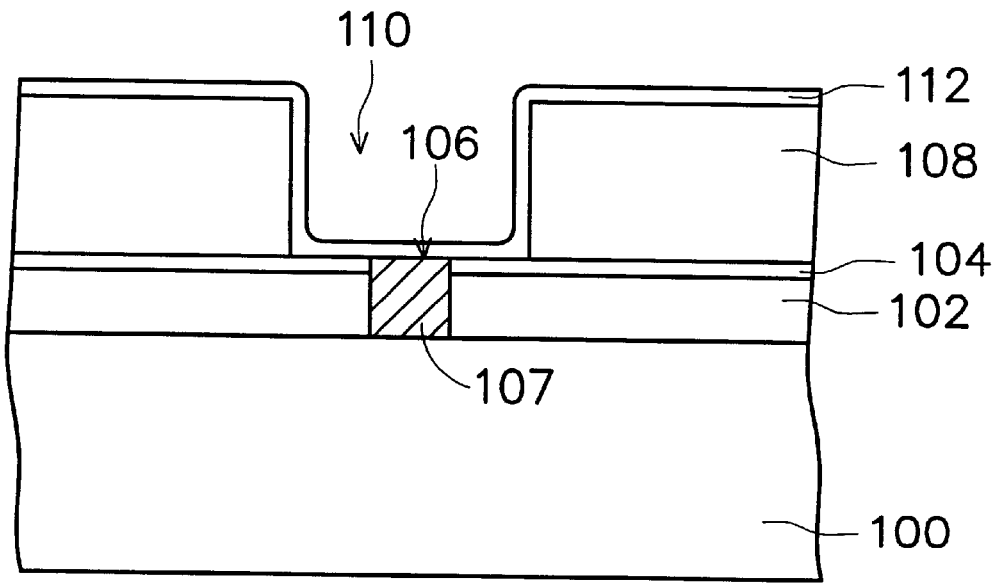
Figure 1D:
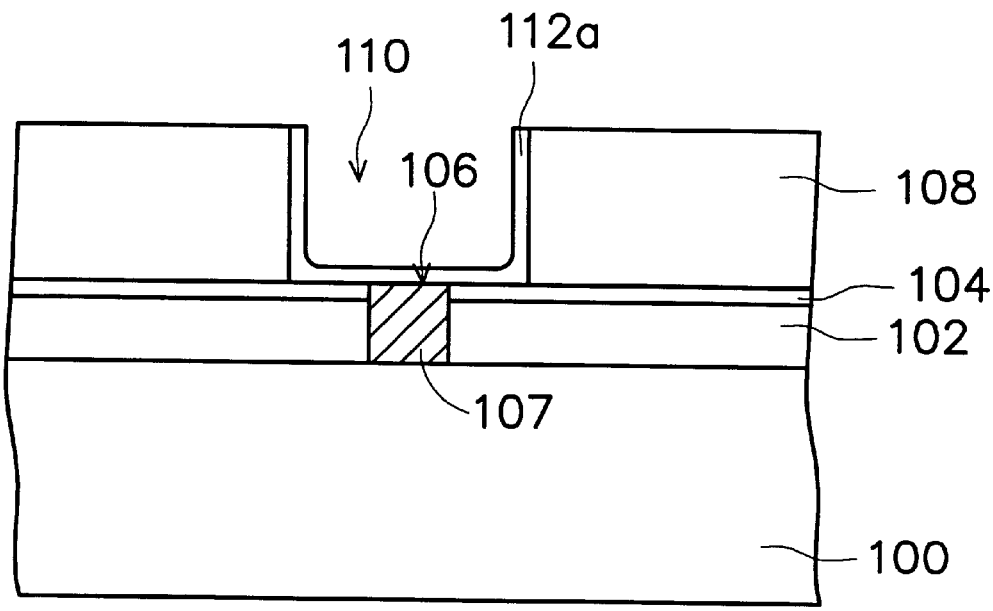
Figure 1E:
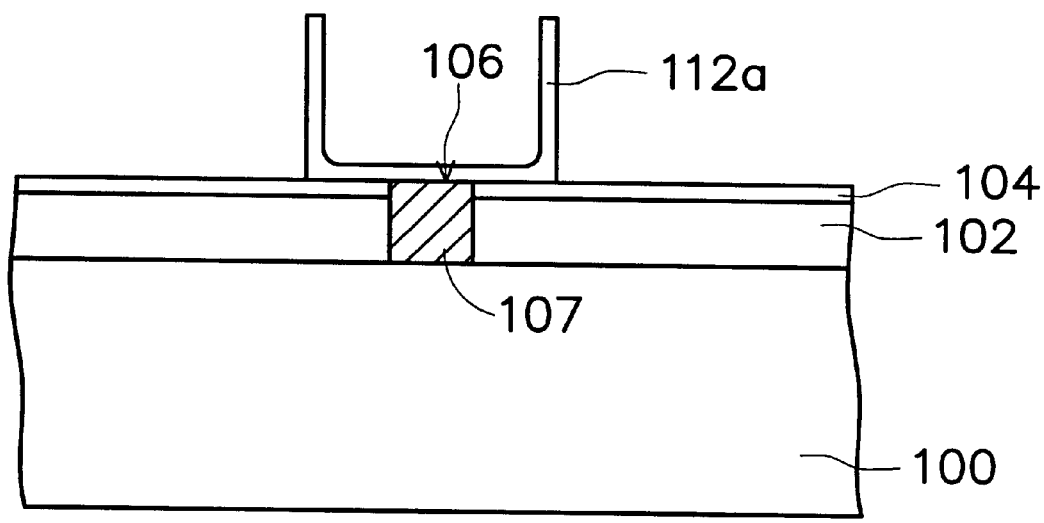
Figure 2A:
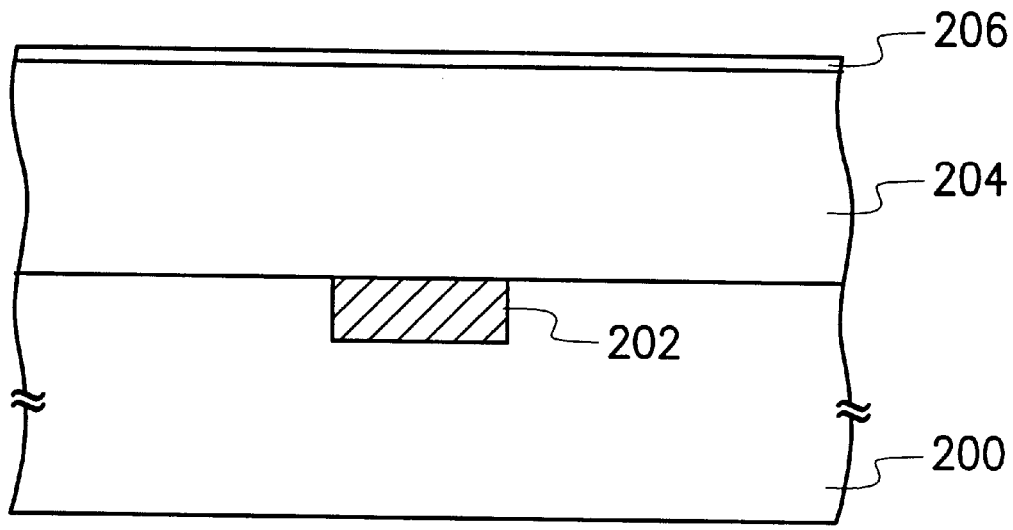
FIGS. 2A to 2H are schematic, cross-sectional views showing the fabrication of a double-sided double crown stacked capacitor according to a preferred embodiment of the present invention.

Referring to FIG. 2A, a dielectric layer 204 and an etching stop layer 206 are formed on a substrate 200. This substrate 200 is, already comprising devices, for example, a semiconductor silicon substrate of a field effect transistor. The device region is depicted with reference numeral 202 in FIG. 2A. The dielectric layer 204, such as silicon oxide, serves as an inter-layer dielectric. The dielectric layer 204 is formed by, for example, chemical vapor deposition. The etching stop layer 206 protects the dielectric layer 204 in the subsequent etching process and prevent damages being induced to the dielectric layer 204. The etching stop layer 206, such as silicon nitride, is formed by, for example, chemical vapor deposition.

Figure 2B:
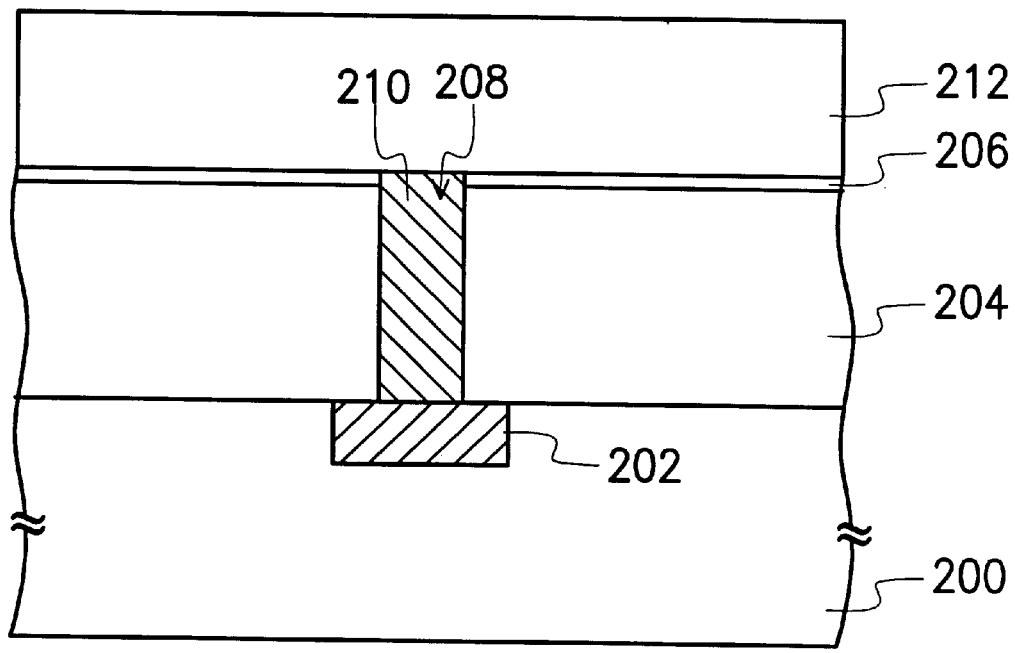

As shown in FIG. 2B, photolithography and etching are conducted to define a contact opening 208 in the dielectric layer 204 and the etching stop layer 206, and a contact plug 210 is further formed in the contact opening 208. The contact plug 210 is formed by, for example, chemical vapor depositing a conductive layer (not shown in Figure) on the substrate 200 to cover the etching stop layer 206 and filling the contact opening 208. The conductive layer which covers the surface of the etching stop layer 206 is further removed, for example, by reactive ion etching. The conductive layer for the formation of the contact plug 210 is, for example, doped polysilicon with a dopant concentration of about 5E19 phosphorous atoms per square centimeter.

After this, a material layer 212 is formed on the substrate 200 to cover the surfaces of the etching stop layer 206 and the contact plug 210. The material layer 212, such as silicon oxide, which comprises a different etching rate from that of the etching stop layer 206, is formed by, for example, chemical vapor deposition.

Figure 2C:
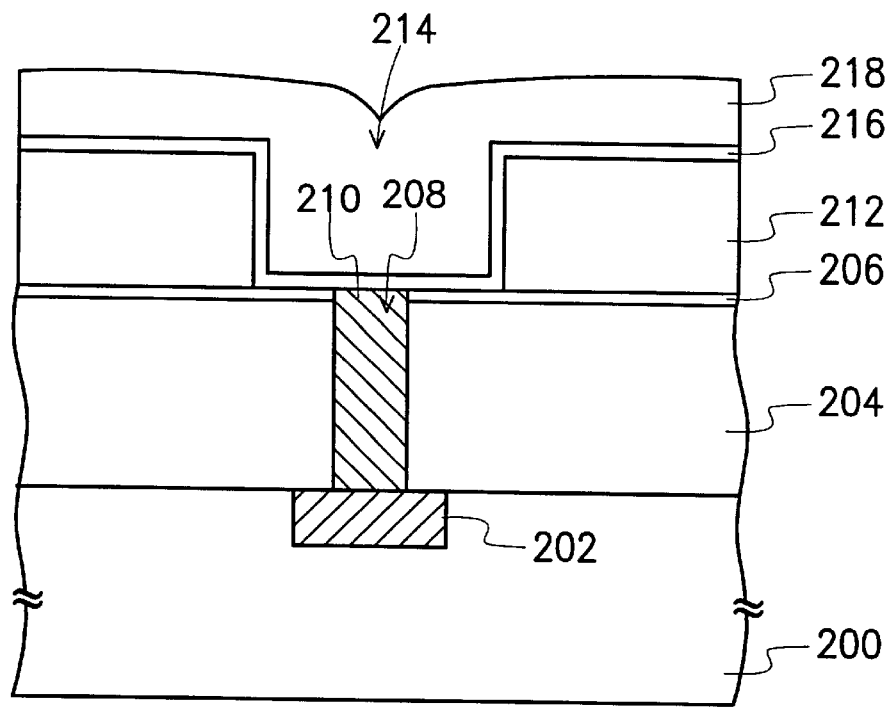

Continuing to FIG. 2C, photolithography and etching are further conducted to form an opening 214 in the material layer 212. This opening 214 exposes the surfaces of the contact plug 210 and a portion of the etching stop layer 206, which is the framework for the first crown structure of the double-sided double crown bottom electrode.

An amorphous silicon layer 216 is conformally formed on the substrate 200, covering the surfaces of the material layer 212 and the sidewall and the bottom of the opening 214. The amorphous silicon layer 216 is formed by, for example, low pressure chemical vapor deposition at a temperature of about 500 degree Celsius to about 520 degree Celsius. The amorphous silicon layer 216 is doped in-situ.

Another material layer 218 is then formed on the substrate 200 to cover the surface of the amorphous silicon layer 216 and filling the opening 214. The material layer 218 can have a similar etching rate as the material layer 212, but have a different etching rate to the etching stop layer 206. In such a case, the material layer 218 is spin-on-glass. The material 218, such as silicon nitride, can have a different etching rate from the material layer 212 and is formed by, for example, chemical vapor deposition.

Figure 2D:
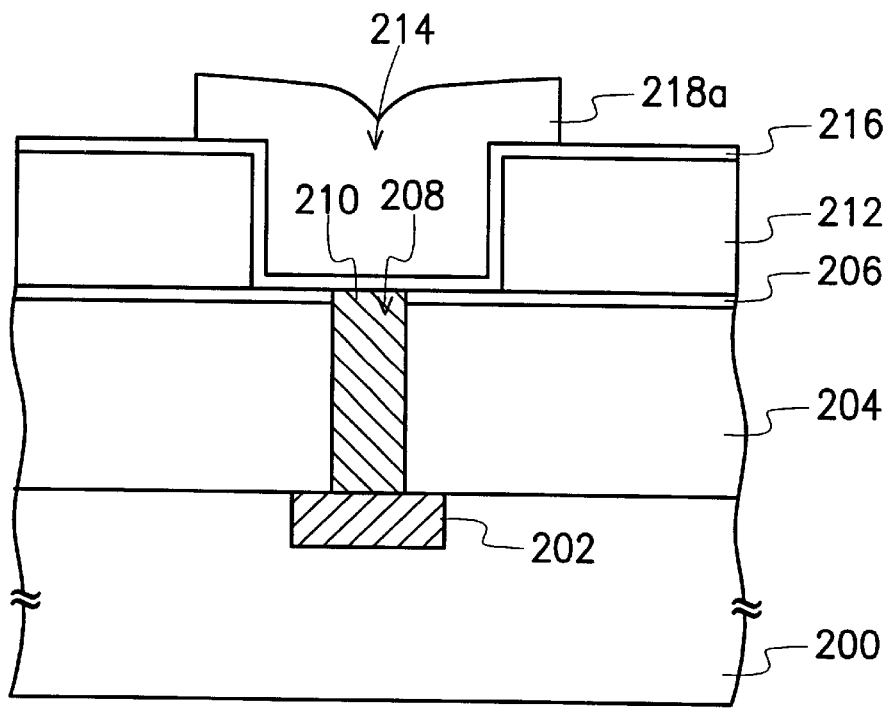

Referring to FIG. 2D, photolithography and etching techniques are used to define the material layer 218, wherein a portion of the amorphous silicon layer 216 which covers the surface of the material layer 212 is exposed. The defined material layer 218a serves as a framework for the second crown structure of the double-sided double crown bottom electrode.

Figure 2E:
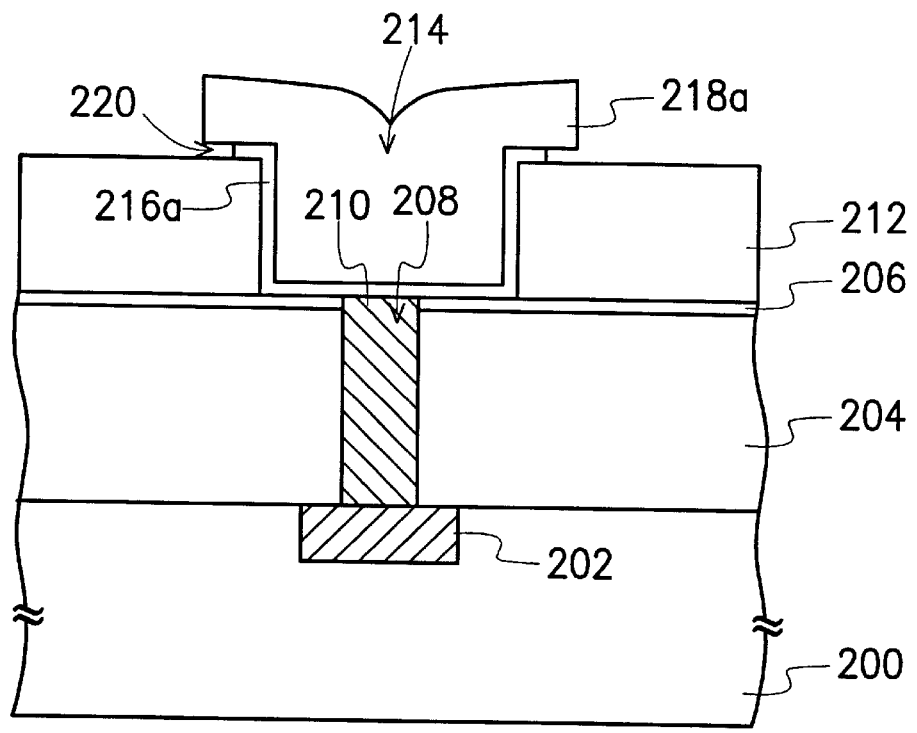

Continuing to FIG. 2E, the amorphous silicon layer 216, not covered by the material layer 218a, is removed. The remaining crown shaped amorphous silicon layer 216a is then used as the first crown structure for the double-sided double crown bottom electrode. The amorphous silicon layer 216 is removed by, for example, isotropic etching such as chemical dry etching (CDE).

During the isotropic etching in removing the amorphous silicon layer 216 not covered by the material layer 218a, a portion of the amorphous silicon layer 216 between the material layer 212 and the material layer 218a is also removed, forming a gap 220 between the material layer 212 and the material layer 218a.

Figure 2F:
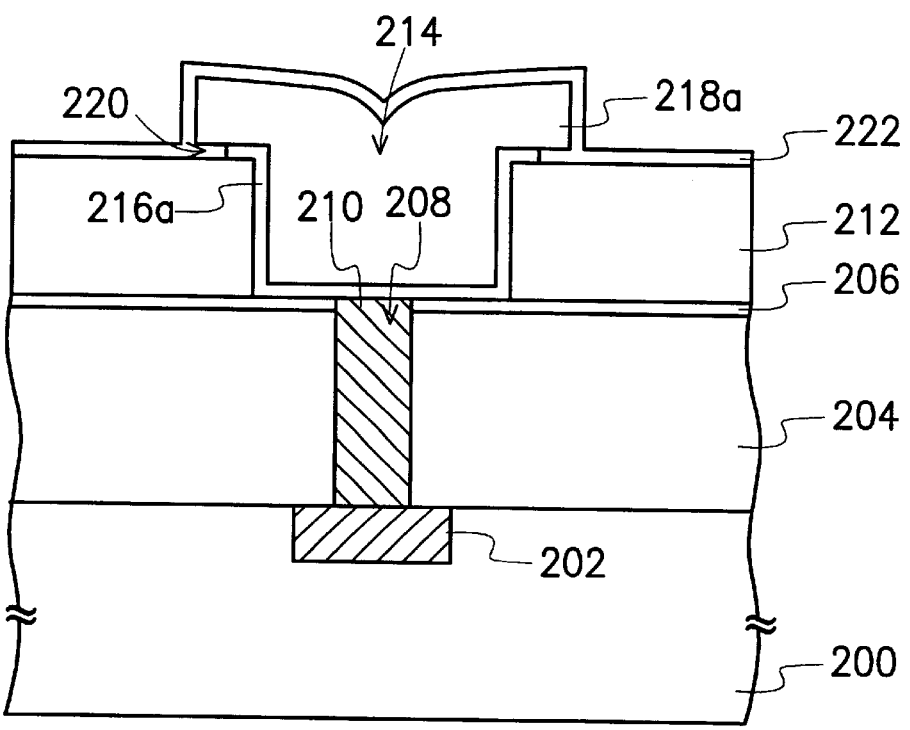
Figure 2G:
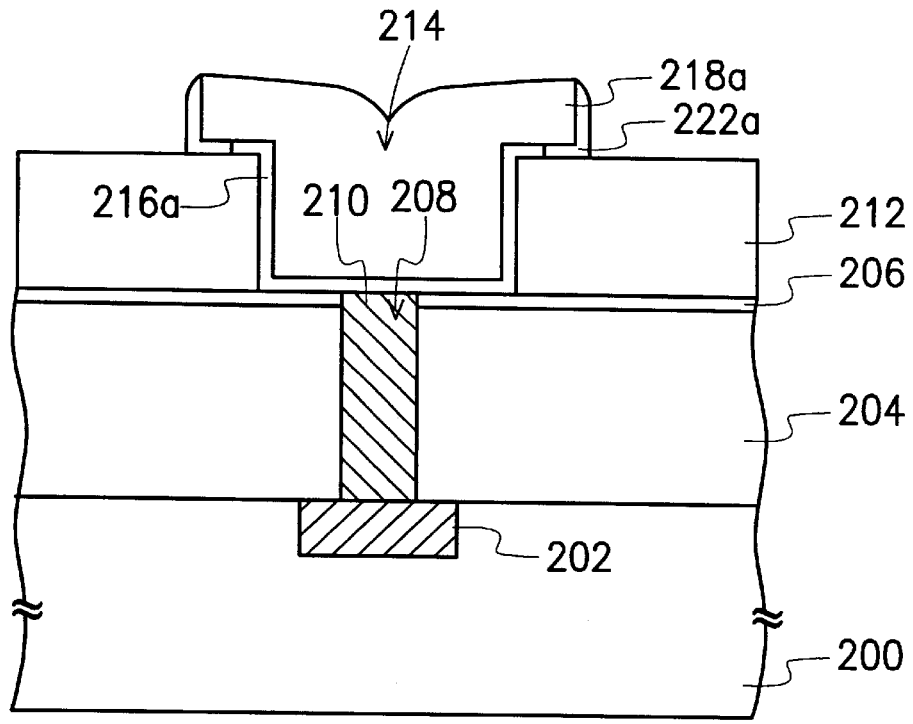

Continuing to FIG. 2F, another amorphous silicon layer 222 is formed on the substrate 200 covering the material layer 212 and the material layer 218a, and filling the gap 220 between the material layer 212 and the material layer 218a. The amorphous silicon layer 222 is formed by, for example, low pressure chemical vapor deposition at a temperature of about 500 degree Celsius to about 520 degree Celsius. The amorphous silicon layer 222 is doped in-situ. As shown in FIG. 2G, an anisotropic etching is conducted to etch the amorphous silicon layer 222, forming the amorphous silicon spacer 222a. The anistropic etching is, for example, reactive ion etching. The amorphous silicon spacer 222a is the second crown structure of the double sided double crown bottom electrode of the present invention. The amorphous silicon spacer 222a and the crown shaped amorphous silicon layer 216a together form the major framework for the double-sided double crown bottom electrode of the present invention.

Figure 2H:
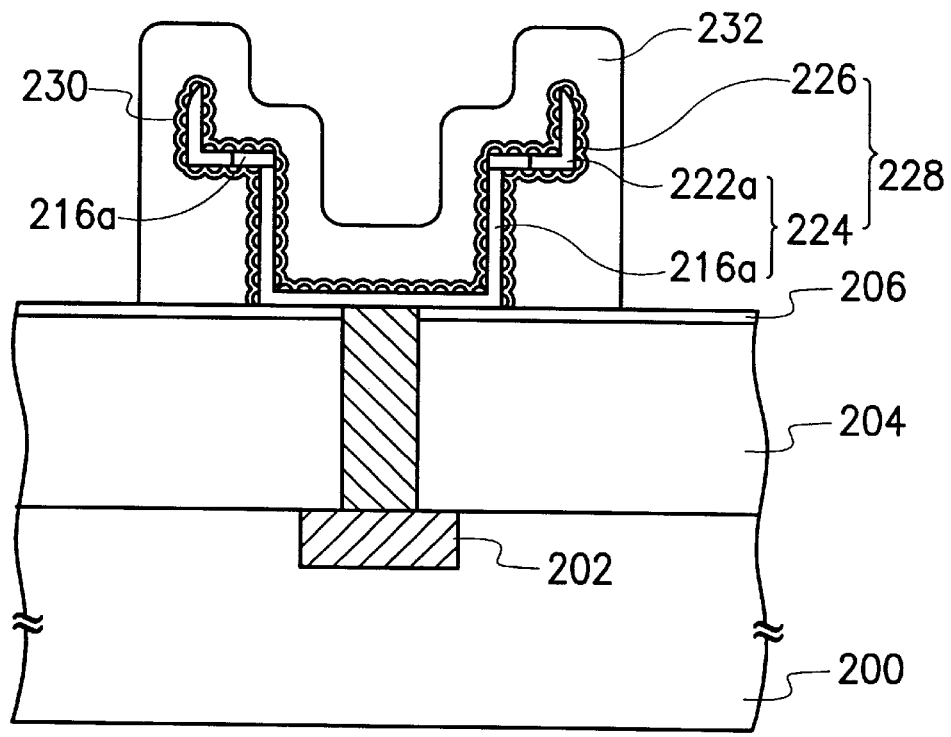

As shown in FIG. 2H, the material layer 218a and the material layer 212 are removed to expose the surfaces of the amorphous silicon spacer 222a and the crown shaped amorphous silicon layer 216a. The amorphous silicon spacer 222a and the crown shaped amorphous silicon layer 216a are the framework of the major structure 224 of the double-sided double crown bottom electrode of the present invention.

When the material layer 218a has a similar etching rate as the material layer 212 but has a different etching rate from that of the etching stop layer 206, the etching stop layer 206 can serve as an etch stop. The material layer 212 and the material layer 218a are simultaneously removed in one etching step. As an example, when the material layer 218a is spin-on-glass, the material layer 212 is silicon oxide and the etching stop layer 206 is silicon nitride, a preferred approach to remove the material layer 212 and the material layer 218a is by wet etching using the buffer oxide etchant (BOE).

When the material layer 218a and the material layer 212 have different etching rates and the material layer 212 and the etching stop layer 206 also have different etching rates, for example, when the material layer 218a is silicon nitride, the material layer 212 is silicon oxide and the etching stop layer 206 is silicon nitride, the material layer 218a is first removed by wet etching using hot phosphoric acid with the material layer 212 serving as an etching stop layer. The material layer 212 is then removed with wet etching using buffer oxide etchant with the etching stop layer 206 as an etch stop layer.

Continuing to FIG. 2H, a selective hemispherical grain polysilicon layer 226 is formed on the surface of the major structure 224 of the double-sided double crown bottom electrode to complete the fabrication for the double-sided double crown bottom electrode 228. The hemispherical grain polysilicon layer 226 is formed by forming a nucleus on the exposed surface of the major structure 224 of the bottom electrode using a di-silane ($Si_2H_6$) or silane ($SiH_4$) gas source and under a high vacuum environment ($10^{-3}$ to $10^{-4}$ Torr). In another words, a seeding process is performed. A thermal treatment is further conducted under an ultra high vacuum environment ($10^{-8}$ to $10^{-9}$ Torr) to cause the silicon atom of amorphous silicon layer to migrate to the nucleus of the hemispherical grain polysilicon, allowing each nucleus to grow into the hemispherical grain polysilicon.

At this point, the double-sided double crown bottom electrode 228 is thus formed. A dielectric layer 230 and an upper electrode 232 of the capacitor are then sequentially formed to complete the fabrication of a double-sided double crown capacitor. The dielectric layer 230, such as silicon nitride/silicon oxide, is formed by, for example, chemical vapor deposition. The conductive layer used for the manufacturing of the upper electrode 232 includes doped polysilicon, and the upper electrode 232 is formed by, for example, chemical vapor deposition.

To increase the surface area of the bottom electrode according to the present invention is through the formation of a bottom electrode with a double-sided double crown structure. The memory capacity of the memory device is thereby increased.

The double-sided double crown bottom electrode of the present invention is formed by the crown shaped amorphous silicon and the amorphous silicon spacer. The adhesion between the crown shaped amorphous silicon and the amorphous silicon spacer of the present invention is superior.

The fabrication method for a stacked capacitor according to the present invention only applies the typical deposition, photolithography and etching techniques to achieve the purpose of increasing the memory capacity of a memory device. Since the more expensive chemical mechanical polishing process is not required for the fabrication of a stacked capacitor in the present invention and the process window according to the fabrication method of the present invention is greater, the method of the present invention is more simple and the manufacturing cost is lower.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a stacked capacitor, the method comprising the steps of:
    providing a substrate
    forming a first dielectric layer on the substrate;
    forming an etching stop layer on the first dielectric layer;
    forming a contact plug in the first dielectric layer and the etching stop layer;
    forming a patterned first material layer on the etching stop layer, wherein the patterned first material layer comprises an opening which exposes a surface of the contact plug and a portion of a surface of the etching stop layer;
    forming a conformal first amorphous silicon layer on the substrate;
    forming a second material layer on the first amorphous silicon layer and filling the opening;
    patterning the second material layer;
    removing the first amorphous silicon layer not covered by the patterned second material layer to expose a portion of the first material layer;
    forming a second amorphous silicon layer on the substrate;
    anisotropic etching the second amorphous silicon layer to form an amorphous silicon spacer;
    removing the second material layer;
    removing the first material layer to expose the first amorphous silicon layer and the amorphous silicon spacer which are a framework for the bottom electrode;
    forming a second dielectric layer on a surface of the bottom electrode; and
    forming a conductive layer on the substrate to serve as an upper electrode.

2. The fabricating method for a stacked capacitor according to claim 1, wherein before the step of forming the second dielectric layer further includes forming a selective hemispherical grain polysilicon layer on a surface of the bottom electrode.

3. The fabricating method for a stacked capacitor according to claim 1, wherein the second material layer and the first material layer have different etching rates.

4. The fabricating method for a stacked capacitor according to claim 1, wherein the second material layer and the first material layer have similar etching rates, but the first material layer and the etching stop layer have different etching rates.

5. The fabricating method for a stacked capacitor according to claim 4, wherein the first material layer includes silicon oxide.

6. The fabricating method for a stacked capacitor according to claim 4, wherein the second material layer includes spin-on-glass.

7. The fabricating method for a stacked capacitor according to claim 4, wherein the first material layer and the second material layer are removed in a same etching process.

8. The fabricating method for a stacked capacitor according to claim 1, wherein the first amorphous silicon layer not covered by the patterned second material layer is removed by isotropic etching.

9. The fabricating method for a stacked capacitor according to claim 8, wherein the isotropic etching includes chemical dry etching.

10. The fabricating method for a stacked capacitor according to claim 1, wherein the anisotropic etching performed on the second amorphous silicon layer is reactive ion etching.

11. A method for fabricating a stacked capacitor comprising the steps of:
    providing a substrate;
    forming a first dielectric layer on the substrate;
    forming an etching stop layer on the first dielectric layer;
    forming a contact plug in the first dielectric layer and the etching stop layer;
    forming a patterned silicon oxide layer on the etching stop layer, wherein the silicon oxide layer comprises an opening that exposes a surface of the contact plug and a portion of a surface of the etching stop layer.

forming a conformal first amorphous silicon layer on the substrate;

forming a spin-on-glass layer on the substrate to cover the first amorphous silicon layer and filling the opening;

patterning the spin-on glass layer to expose a portion of the first amorphous silicon layer;

isotropically etching the exposed first amorphous silicon layer and a portion of the first amorphous silicon layer between the spin-on-glass layer and the silicon oxide layer;

forming a second amorphous silicon layer on the substrate;

anisotropically etching the second amorphous silicon layer to form an amorphous silicon spacer;

removing the spin-on-glass layer and the silicon oxide layer to expose the first amorphous silicon layer and the amorphous silicon spacer;

forming a selective hemispherical grain polysilicon layer on surfaces of the first amorphous silicon layer and the amorphous silicon spacer to form a bottom electrode;

forming a second dielectric layer on a surface of the bottom electrode; and forming a conductive layer on the substrate to form an upper electrode.

12. The method for fabricating a stacked capacitor according to claim 11, wherein the silicon oxide layer and the etching stop layer have different etching rates.

13. The method for fabricating a stacked capacitor according to claim 11, the step of isotropically etching the exposed first amorphous silicon layer and the portion of the first amorphous silicon layer between the spin-on-glass layer and the silicon oxide layer includes chemical dry etching.

14. The method for fabricating a stacked capacitor according to claim 13, wherein the step of anisotropically etching the second amorphous silicon layer includes reactive ion etching.

* * * * *